(12) United States Patent
Wakiya et al.

(10) Patent No.: US 9,172,010 B2
(45) Date of Patent: Oct. 27, 2015

(54) LIGHT-EMITTING DEVICE, LIGHTING DEVICE, LIGHT-EMITTING DEVICE ASSEMBLY, AND METHOD FOR PRODUCING LIGHT-EMITTING DEVICE

(71) Applicant: NITTO DENKO CORPORATION, Ibaraki-shi, Osaka (JP)

(72) Inventors: Shinsuke Wakiya, Osaka (JP); Toshikazu Takagi, Osaka (JP); Hirofumi Fukutsuka, Osaka (JP); Yasunari Ooyabu, Osaka (JP); Hiroyuki Katayama, Osaka (JP); Takashi Kondo, Osaka (JP); Hiroki Kono, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 43 days.

(21) Appl. No.: 13/778,515

(22) Filed: Feb. 27, 2013

(65) Prior Publication Data

US 2013/0228803 A1 Sep. 5, 2013

(30) Foreign Application Priority Data

Mar. 2, 2012 (JP) ................................. 2012-046876

(51) Int. Cl.
*H01L 33/50* (2010.01)
*H01L 25/075* (2006.01)
*H01L 33/60* (2010.01)

(52) U.S. Cl.
CPC ........... *H01L 33/508* (2013.01); *H01L 25/0753* (2013.01); *H01L 33/60* (2013.01); *H01L 2224/48091* (2013.01); *H01L 2933/0041* (2013.01)

(58) Field of Classification Search
CPC .................. H01L 29/60; H01L 33/508; H01L 2224/48091; H01L 33/60; H01L 2933/0041; H01L 25/0753
USPC ............................................... 257/88, 98–100
See application file for complete search history.

(56) References Cited

U.S. PATENT DOCUMENTS

| 6,608,334 | B1 * | 8/2003 | Ishinaga ........................ 257/100 |
| 7,514,867 | B2 * | 4/2009 | Yano et al. .................... 313/512 |
| 2003/0214233 | A1 * | 11/2003 | Takahashi et al. ............ 313/512 |
| 2006/0214578 | A1 | 9/2006 | Iwanaga et al. |

(Continued)

FOREIGN PATENT DOCUMENTS

| EP | 2 416 389 A1 | 2/2012 |
| JP | 2010-123802 A | 6/2010 |

OTHER PUBLICATIONS

European Search Report issued in corresponding EP Application No. 13157173.9, dated Jun. 28, 2013.

*Primary Examiner* — Jae Lee
*Assistant Examiner* — Mohammed R Alam
(74) *Attorney, Agent, or Firm* — Sughrue Mion, PLLC

(57) ABSTRACT

A light-emitting device includes a substrate including a mirror surface region on its upper surface, a semiconductor light-emitting element disposed in the mirror surface region, and an encapsulating layer joined onto the upper surface of the substrate. The encapsulating layer includes a lower layer that is in contact with the upper surface of the substrate, covers the surrounding of the semiconductor light-emitting element, and contains phosphor; and an upper layer that is positioned on the lower layer, and has a larger phosphor content per unit area than that of the lower layer.

7 Claims, 14 Drawing Sheets

(56) References Cited

U.S. PATENT DOCUMENTS

| | | |
|---|---|---|
| 2008/0210961 A1 | 9/2008 | Lin et al. |
| 2008/0284315 A1* | 11/2008 | Tasumi et al. ............... 313/503 |
| 2009/0124031 A1* | 5/2009 | Tung ............................. 438/26 |
| 2011/0012143 A1* | 1/2011 | Yuan et al. ..................... 257/91 |
| 2011/0104834 A1* | 5/2011 | Suehiro et al. ................ 438/27 |
| 2011/0284887 A1* | 11/2011 | Wu et al. ........................ 257/91 |

\* cited by examiner

FIG.12
FIG.12A
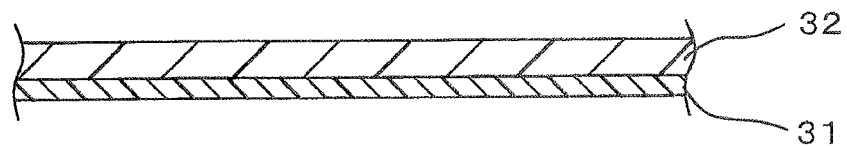
FIG.12B
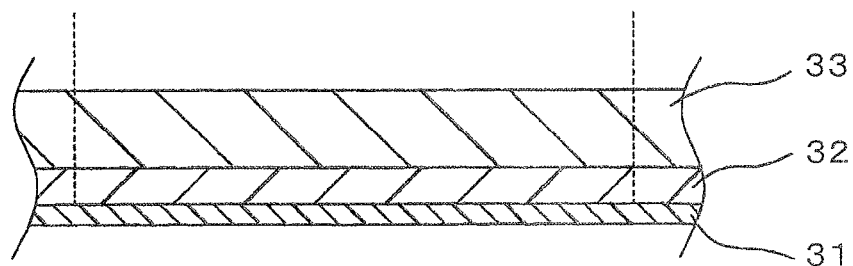

FIG.13
FIG.13A
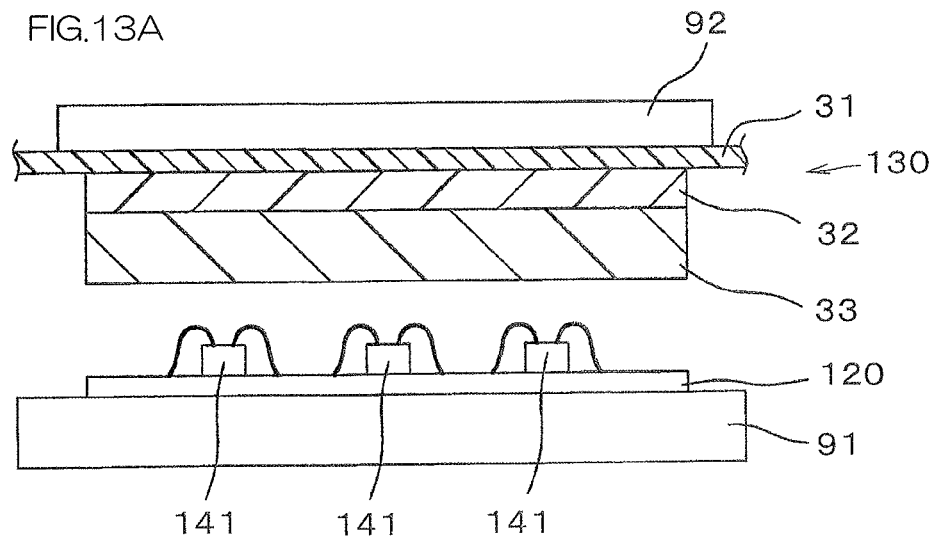
FIG.13B
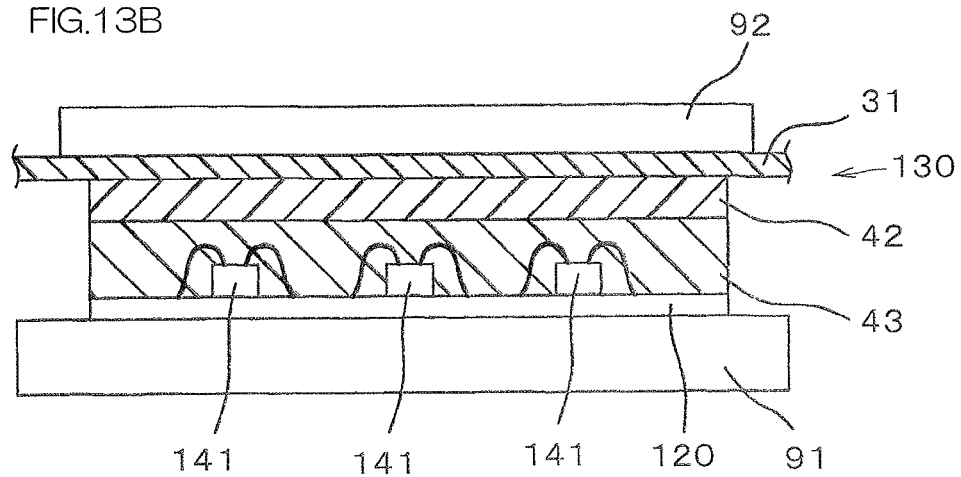

LIGHT-EMITTING DEVICE, LIGHTING DEVICE, LIGHT-EMITTING DEVICE ASSEMBLY, AND METHOD FOR PRODUCING LIGHT-EMITTING DEVICE

CROSS-REFERENCE TO RELATED APPLICATION

The present application claims priority from Japanese Patent Application No. 2012-046876 filed on Mar. 2, 2012, the contents of which are hereby incorporated by reference into this application.

BACKGROUND OF THE INVENTION

1. Field of the Invention

The present invention relates to a light-emitting device including a semiconductor light-emitting element.

2. Description of Related Art

Conventionally, it has been known that semiconductor light-emitting elements such as light-emitting diodes (LED) are encapsulated with resin. For example, Japanese Unexamined Patent Publication No. 2010-123802 has proposed production of an optical semiconductor device by encapsulating a semiconductor light-emitting element using an encapsulating sheet having a first resin layer containing phosphor, and a second resin layer that encapsulates the semiconductor light-emitting element.

In such an optical semiconductor device, for example, use of phosphor composed of YAG phosphor and a semiconductor light-emitting element composed of blue LED allow for production of white light by mixing of blue light from the blue LED and yellow light from the YAG phosphor.

SUMMARY OF THE INVENTION

Meanwhile, with the encapsulating sheet described in Japanese Unexamined Patent Publication No. 2010-123802 above, the blue light that travels in the direction of lamination of the first resin layer and the second resin layer is appropriately mixed with the yellow light from the YAG phosphor to produce white light, but with the blue light that travels in the direction that is different from the lamination direction, color mixture balance with the yellow light from the YAG phosphor is destroyed, and white light may not be produced.

For example, when the second resin layer does not contain phosphor, there is a case where the blue light from the blue LED does not pass through the first resin layer, and comes out from the side face (side face in the direction perpendicular to the lamination direction) of the second resin layer. In this case, when the light-emitting device is visually checked from the direction perpendicular to the lamination direction, it looks like blue light is emitted from the light-emitting device.

Furthermore, when the second resin layer contains a small amount of phosphor, and when the light-emitting device is visually checked in the direction perpendicular to the lamination direction, blue light from blue LED becomes stronger than the yellow light from the YAG phosphor, and it looks like blue light is emitted from the light-emitting device. When the second resin layer contains a large amount of phosphor, and when the light-emitting device is visually checked in the direction perpendicular to the lamination direction, the yellow light from the YAG phosphor becomes stronger than the blue light from the blue LED, and it looks like yellow light is emitted from the light-emitting device.

Thus, chromaticity of light from the light-emitting device changes depending on the angle (viewing angle) at which the light-emitting device is visually checked.

Meanwhile, the light from the phosphor is scattering light, and therefore when the resin layer is thick, light cannot be guided efficiently in a desired direction.

A main object of the present invention is to reduce changes in the chromaticity of the light from light-emitting devices depending on the viewing angle, and to allow efficient light emission from the light-emitting device.

A light-emitting device of the present invention includes
a substrate including a mirror surface region on its upper surface;
a semiconductor light-emitting element disposed in the mirror surface region; and
an encapsulating layer joined onto the upper surface of the substrate; wherein the encapsulating layer includes a lower layer that is in contact with the upper surface of the substrate, covers the surrounding of the semiconductor light-emitting element, and contains phosphor, and
an upper layer that is positioned on the lower layer and has a larger phosphor content per unit area than that of the lower layer.

In the light-emitting device of the present invention, it is preferable that the substrate includes an aluminum substrate, an insulating layer disposed above the aluminum substrate, and wiring formed on the insulating layer, wherein the mirror surface region is the surface of the aluminum substrate.

In the light-emitting device of the present invention, it is preferable that the encapsulating layer is rectangular, and a pair of opposing edges of the encapsulating layer coincides with a pair of edges of the substrate.

In the light-emitting device of the present invention, it is preferable that the mirror surface region is present up to the pair of edges of the substrate.

In the light-emitting device of the present invention, it is preferable that a plurality of semiconductor light-emitting elements that are connected in series are disposed in the mirror surface region, and a wire that connects the plurality of semiconductor light-emitting elements is not in contact with the mirror surface region.

In the light-emitting device of the present invention, it is preferable that electrodes that are on the substrate and are connected to the electrodes of the semiconductor light-emitting elements are covered with the encapsulating layer.

In the light-emitting device of the present invention, it is preferable that the mirror surface region is long and narrow, a plurality of semiconductor light-emitting elements are disposed along the mirror surface region, and the encapsulating layer is joined onto the upper surface of the substrate along the mirror surface region.

A lighting device of the present invention includes the above-described light-emitting device, a housing in which the light-emitting device is disposed, and a window portion attached to the housing, through which the light from the light-emitting device passes through.

A light-emitting device assembly of the present invention includes a continuous substrate including a mirror surface region on its upper surface, and having a plurality of sections corresponding to substrates of a plurality of light-emitting devices; a plurality of semiconductor light-emitting elements disposed in the mirror surface region; and an encapsulating layer joined onto the upper surface of the continuous substrate, extending over the plurality of sections corresponding to the substrates of the plurality of light-emitting devices; wherein the encapsulating layer includes a lower layer that is in contact with the upper surface of the continuous substrate, covers the surrounding of the plurality of semiconductor light-emitting elements, and contains phosphor, and an upper layer that is positioned on the lower layer, and has a larger phosphor content per unit area than that of the lower layer.

In the light-emitting device assembly of the present invention, it is preferable that the mirror surface region is present on the upper surface of the continuous substrate, extending over the plurality of sections corresponding to the substrates of the plurality of light-emitting devices.

A method for producing a light-emitting device of the present invention includes disposing a semiconductor light-emitting element in mirror surface region provided in the upper surface of a substrate; connecting the semiconductor light-emitting element with electrodes of the substrate; disposing a two-layer structure encapsulating sheet on the upper surface of the substrate, thereby covering the surrounding of the semiconductor light-emitting element with a lower layer of the encapsulating sheet; and curing the encapsulating sheet, thereby forming an encapsulating layer joined to the upper surface from the encapsulating sheet, wherein the lower layer and the upper layer of the encapsulating layer contain phosphor, and the upper layer has a larger phosphor content per unit area than that of the lower layer.

A method for producing a light-emitting device of the present invention includes disposing a plurality of semiconductor light-emitting elements in a mirror surface region provided in the upper surface of a continuous substrate having a plurality of sections corresponding to substrates of a plurality of light-emitting devices; connecting the plurality of semiconductor light-emitting elements with electrodes of the continuous substrate; disposing a two-layer structure encapsulating sheet on the upper surface of the continuous substrate so as to extend over the plurality of sections corresponding to the substrates of the plurality of light-emitting devices, thereby covering the surrounding of the plurality of semiconductor light-emitting elements with a lower layer of the encapsulating sheet; curing the encapsulating sheet, thereby forming an encapsulating layer joined to the upper surface from the encapsulating sheet; and cutting the continuous substrate and the encapsulating layer, thereby separating the plurality of sections, wherein the lower layer and the upper layer of the encapsulating layer contain phosphor, and the upper layer has a larger phosphor content per unit area than that of the lower layer.

The present invention allows for easy reduction of changes in the chromaticity of the light output from the light-emitting device depending on the viewing angle. Furthermore, luminous efficacy of the light-emitting device can be improved.

BRIEF DESCRIPTION OF THE DRAWINGS

FIG. 12.A is a diagram illustrating a method for producing an encapsulating sheet.
FIG. 12.B is a diagram illustrating a method for producing an encapsulating sheet.
FIG. 13.A is a cross-sectional view illustrating a light-emitting device assembly during production.
FIG. 13.B is a cross-sectional view illustrating a light-emitting device assembly during production.

DETAILED DESCRIPTION OF THE INVENTION

Figure 1:
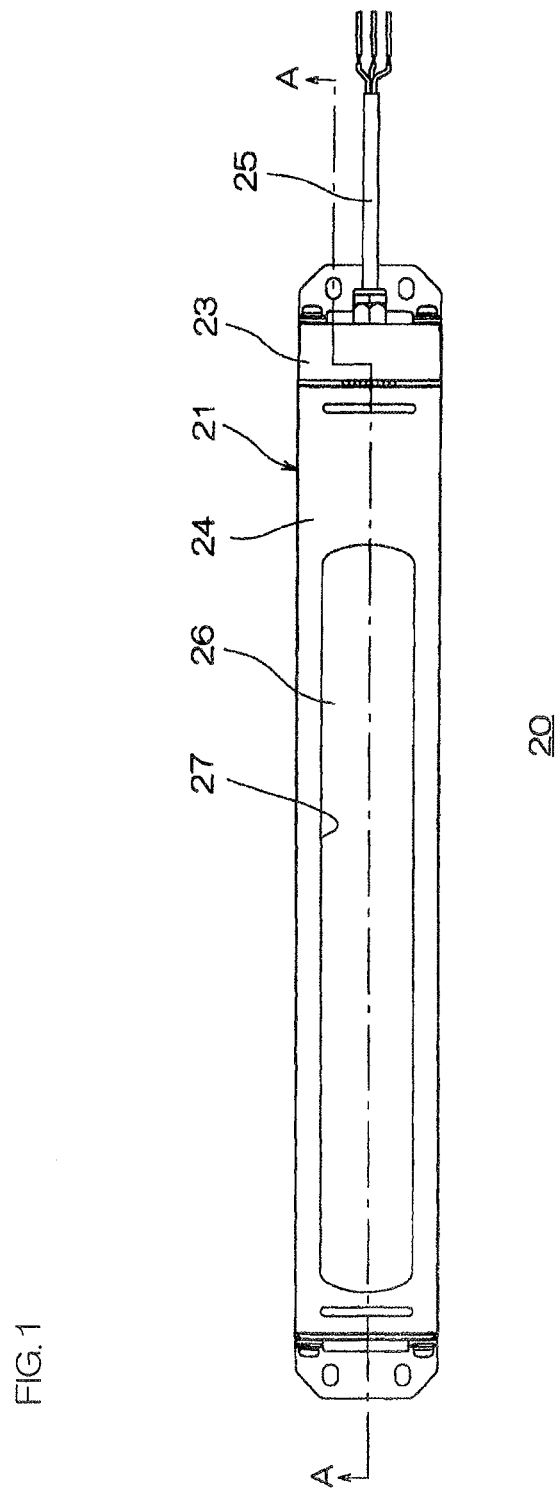
FIG. 1 is a plan view of a lighting device.
Figure 2:
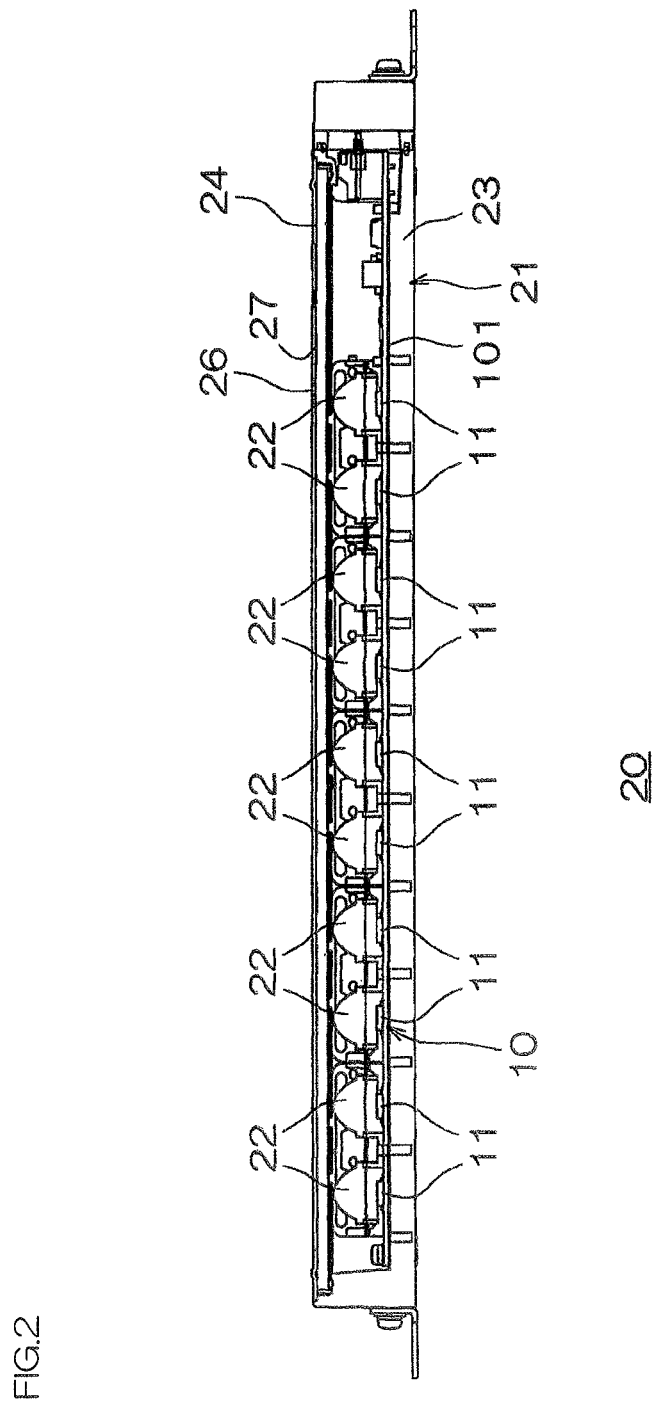
FIG. 2 is a cross section of the lighting device.

FIG. 1 is a plan view of a lighting device 20 in an embodiment of the present invention. FIG. 2 is a cross-sectional view of the lighting device 20 taken along line A-A. The lighting device 20 includes a housing 21 inside which a light emission assembly 10 is disposed. The housing 21 is formed into a generally box shape extending in a predetermined direction, and includes a base frame 23, a cover member 24, and a power source cable 25.

The base frame 23 extends in the longitudinal direction of the housing 21, and formed into a generally rectangular frame shape opening toward the upper side (one side in directions perpendicular to the longitudinal direction, the same applies to the following) when viewed from the top. The base frame 23 constitutes the lower side (the other side in directions perpendicular to the longitudinal direction, the same applies to the following) half of the housing 21.

The cover member 24 is attached to the housing 21. The cover member 24 is formed into a generally U-shape so as to cover the base frame 23 from the upper side, extending into the longitudinal direction of the housing 21. The cover member 24 is formed with a window portion 27 extending in the longitudinal direction and penetrating the cover member 24. A glass plate 26 fits in the window portion 27.

The power source cable 25 is supported so as to allow communication between the inside and outside of the base frame 23 at one end portion in the longitudinal direction of the base frame 23. In the base frame 23, the power source cable 25 is electrically connected to the circuit board 101 of the light emission assembly 10.

The light emission assembly 10 is formed into a generally rectangular flat plate form when viewed from the top, extending in the longitudinal direction of the housing 21. In the light emission assembly 10, a plurality of light-emitting devices 11 are arranged parallely in spaced-apart relation in the longitudinal direction on one circuit board 101. The light emission assembly 10 includes a plurality of lenses 22.

One lens 22 is provided to one light-emitting device 11. Each of the lenses 22 is formed into a convex lens form, and disposed on each of the light-emitting devices 11. The lens 22 orients the light outputted from the light-emitting device 11. The light from the light-emitting device 11 is guided outside passing through the lens 22 and the window portion 27.

Figure 3:
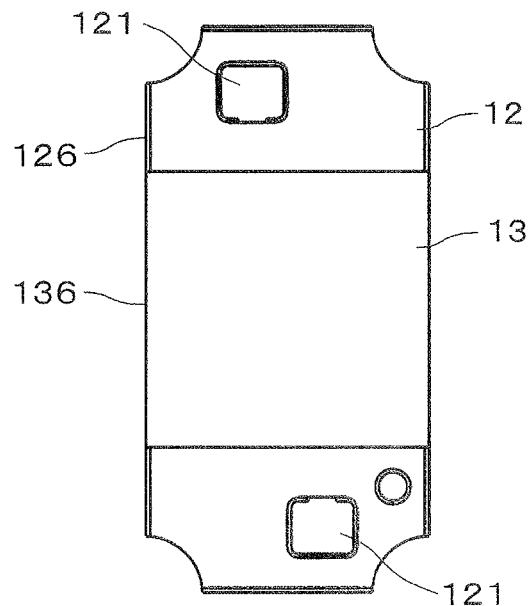
FIG. 3 is a plan view of a light-emitting device.

FIG. 3 is a plan view of a light-emitting device 11. The light-emitting device 11 includes a substrate 12, and an encapsulating layer 13 joined onto the upper surface of the substrate 12. In the following, for purposes of explanation, the front side on the plane of the sheet of FIG. 3 is referred to as "upper side", but the up-down direction does not coincide with the gravity direction.

Figure 4:
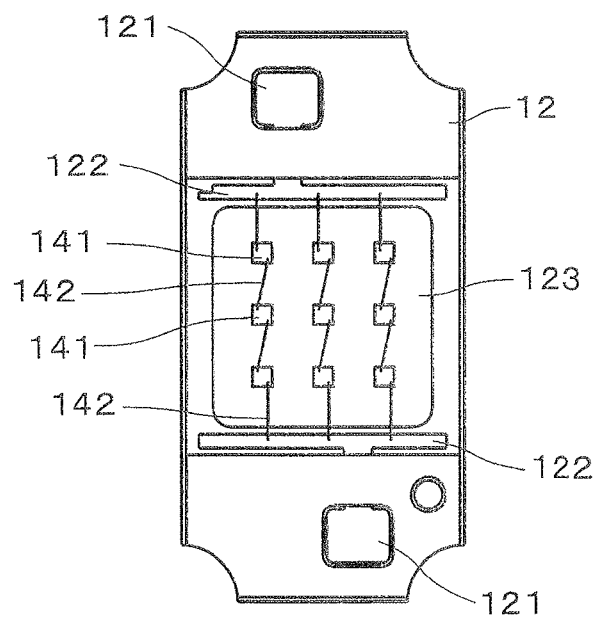
FIG. 4 is a plan view of a light-emitting device excluding an encapsulating layer.

On the upper surface of the substrate 12, external electrodes 121 to be connected to a power source are provided. FIG. 4 shows a plan view of the light-emitting device 11 from which the encapsulating layer 13 is removed. The upper surface of the substrate 12 includes a mirror surface region 123. In the mirror surface region 123, nine light-emitting diodes 141 (hereinafter referred to as "LEDs") are arranged three by three. The LEDs 141 are blue LEDs. At the both sides (upper side and lower side in FIG. 4) of the mirror surface region 123 on the upper surface of the substrate 12, internal electrodes 122 are provided. The external electrodes 121 and the internal electrodes 122 are a part of the wiring pattern in the substrate 12, and are electrically connected.

In FIG. 4, three LEDs 141 that are in line vertically are connected in series between a pair of internal electrodes 122. The connection therebetween is made by a wire 142 of fine metal. The wire 142 is not in contact with the mirror surface region 123. That is, no connection pad for relaying connection is provided in the mirror surface region 123, and the wire 142 is directly passed from the electrode of the LED 141 to the electrode of another LED 141. With no connection pad provided, light output efficiency of the light-emitting device 11 improves.

The internal electrodes 122 connected to the electrode of the LEDs 141 are covered with the encapsulating layer 13. The encapsulating layer 13 protects the entire sections that are related to electrical connection of the LEDs 141.

Figure 5:
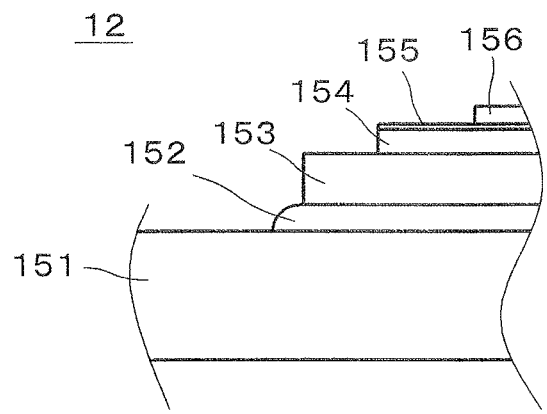
FIG. 5 is a diagram illustrating a cross-sectional structure of a substrate.

FIG. 5 is a diagram illustrating a cross-sectional structure of the substrate 12. In FIG. 5, the thickness of the respective layers in cross sections, and the range of their presence in the horizontal direction are not accurately illustrated.

The substrate 12 includes, from the bottom to the top, an aluminum substrate 151, an adhesive layer 152, an insulating layer 153, wiring 154, a plating 155, and a protection layer 156 in the order mentioned. The upper surface of the aluminum substrate 151 is the mirror surface. The mirror surface region 123 is an exposed region in the surface (that is, upper surface) of the aluminum substrate 151. By forming the aluminum substrate 151 at the lowest position and as the thickest layer, the mirror surface region 123 can be provided for low costs, and heat-dissipation characteristics can be improved.

The insulating layer 153 disposed above the aluminum substrate 151 is allowed to adhere to the aluminum substrate 151 by the adhesive layer 152. The insulating layer 153 is formed of glass epoxy resin. The wiring 154 is formed on the insulating layer 153. The external electrodes 121 and the internal electrodes 122 are a part of the wiring 154. The plating 155 is formed on the wiring 154 to improve joining between the wire 142 and the electrodes. The protection layer 156 is an insulating layer that protects the wiring 154.

Figure 6:
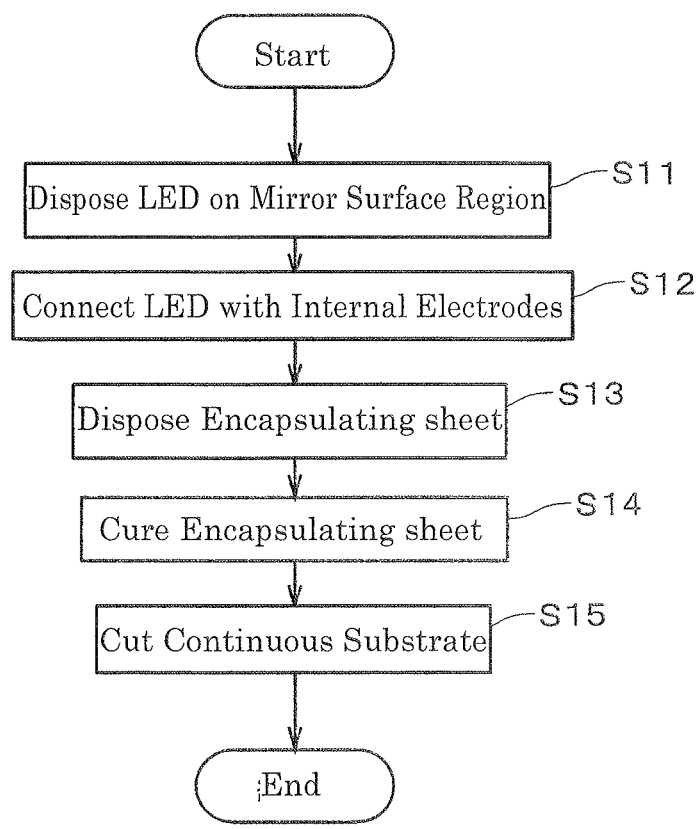
FIG. 6 is a diagram illustrating a flow of light-emitting device production.
Figure 7:
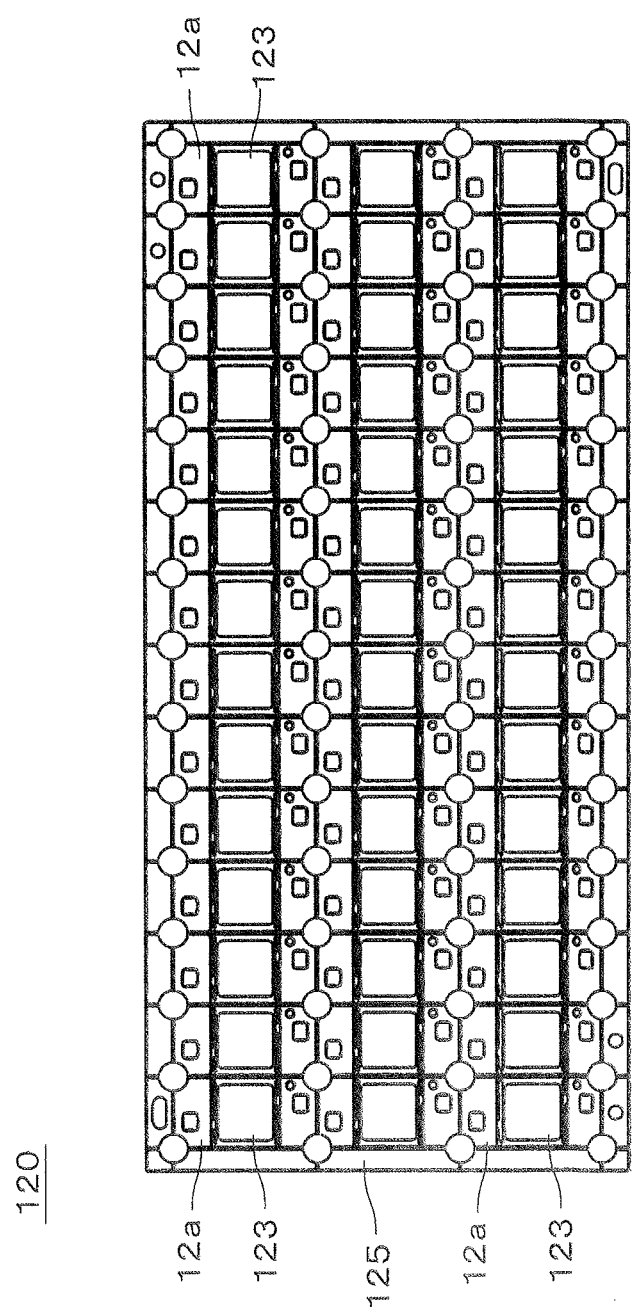
FIG. 7 is a plan view of a continuous substrate.

FIG. 6 is a diagram illustrating a flow of production of the light-emitting device 11. First, a continuous substrate in which a plurality of substrates 12 are continuously formed is prepared. FIG. 7 is a plan view illustrating the continuous substrate 120. In the continuous substrate 120 of FIG. 7, a plurality of sections 12a (hereinafter referred to as "substrate portion") corresponding to substrates 12 arranged in three (row) by fourteen (column) are continuously formed. Thus, the upper surface of the continuous substrate 120 includes the plurality of mirror surface regions 123. At the outside of the substrate portion 12a positioned at the outermost periphery, a rim portion 125 is provided.

In each of the mirror surface region 123, the LEDs 141 are disposed (step S11). The LEDs 141 are allowed to adhere on the upper surface of the aluminum substrate 151. The electrodes of the LEDs 141 are connected to the internal electrodes 122 or the electrodes of other LEDs 141 through the wire 142 (step S12). That is, the electrodes of the respective LEDs 141 are connected directly or indirectly to the internal electrodes 122.

Figure 8:
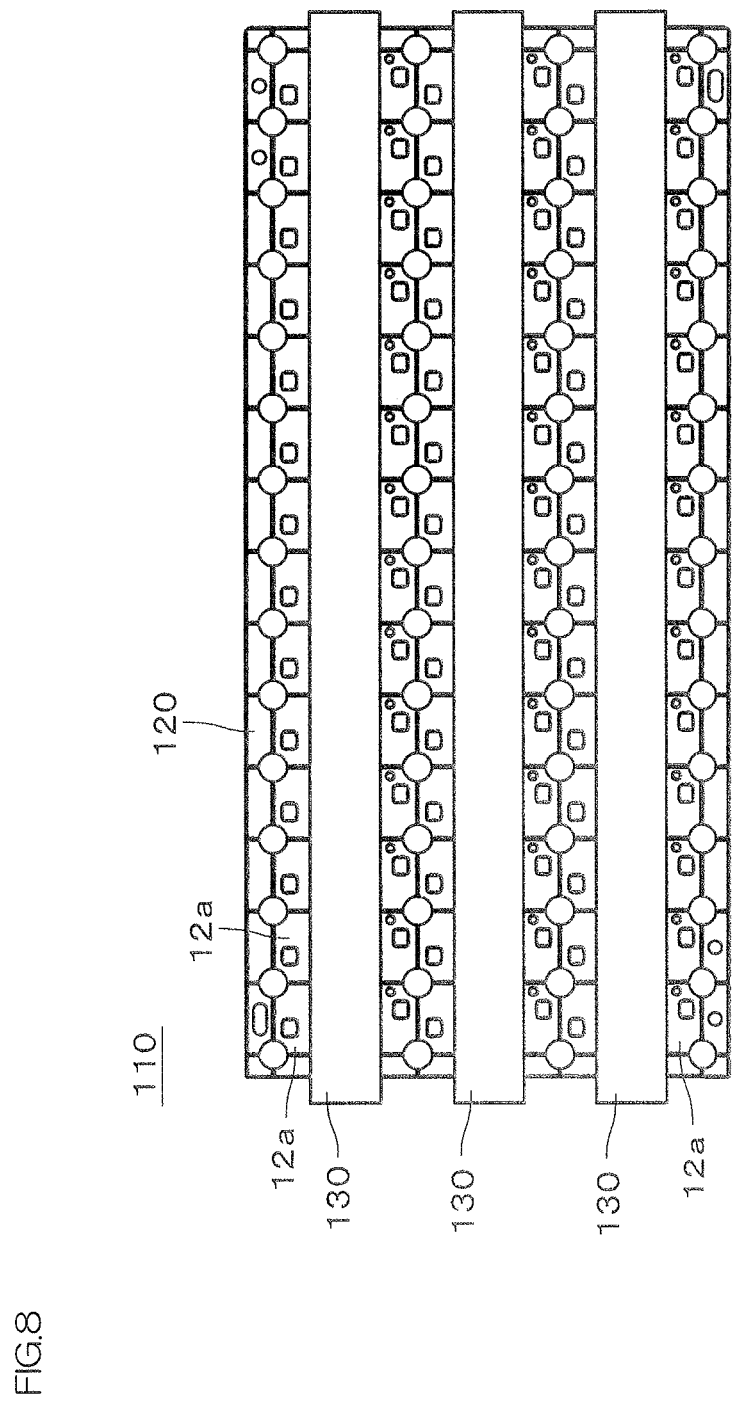
FIG. 8 is a plan view of an encapsulating sheet and the continuous substrate.

Then, an encapsulating sheet, i.e., from which an encapsulating layer 13 is derived, is disposed on the upper surface of the continuous substrate 120 so as to cover the mirror surface region 123 (step S13). FIG. 8 is a diagram illustrating a state where the encapsulating sheets 130 are bonded on the continuous substrate 120. The encapsulating sheet 130 is long and narrow, and is disposed along the mirror surface regions 123 arranged laterally. In other words, the encapsulating sheet 130 is disposed on the upper surface of the continuous substrate 120 so as to extend over the plurality of substrate portions 12a. The encapsulating sheet 130 is very soft, and the plurality of LEDs 141 and the wire 142 enter into the encapsulating sheet 130 to cover the surrounding thereof.

Thereafter, the encapsulating sheet 130 is heated and cured (step S14). In this manner, the encapsulating sheet 130 is thus formed into an encapsulating layer joined onto the upper surface of the continuous substrate 120 extending over the plurality of substrate portions 12a. Hereinafter, the encapsulating layer is also given the reference numeral 130. The encapsulating layer 130 is a continuum of the encapsulating layer 13 of FIG. 3. By curing of the encapsulating sheet 130, a light-emitting device assembly 110 in which a plurality of light-emitting devices 11 are continuously formed is completed.

The light-emitting device assembly 110 is cut so as to be sandwiched vertically by circular cutters, and the cut piece is the light-emitting device 11 shown in FIG. 3 (step S15). At that time, the continuous substrate 120 and the encapsulating layer 130 are cut simultaneously so that the sections corresponding to the respective substrates 12 are separated. As a result, as shown in FIG. 3, the encapsulating layer 13 is formed into a rectangular form when viewed from the top. Also, when viewed from the top, the left and right edges 136 of the encapsulating layer 13, i.e., a pair of opposing edges, coincides with the left and right edges 126 of the substrates 12, i.e., a pair of edges.

Figure 9:
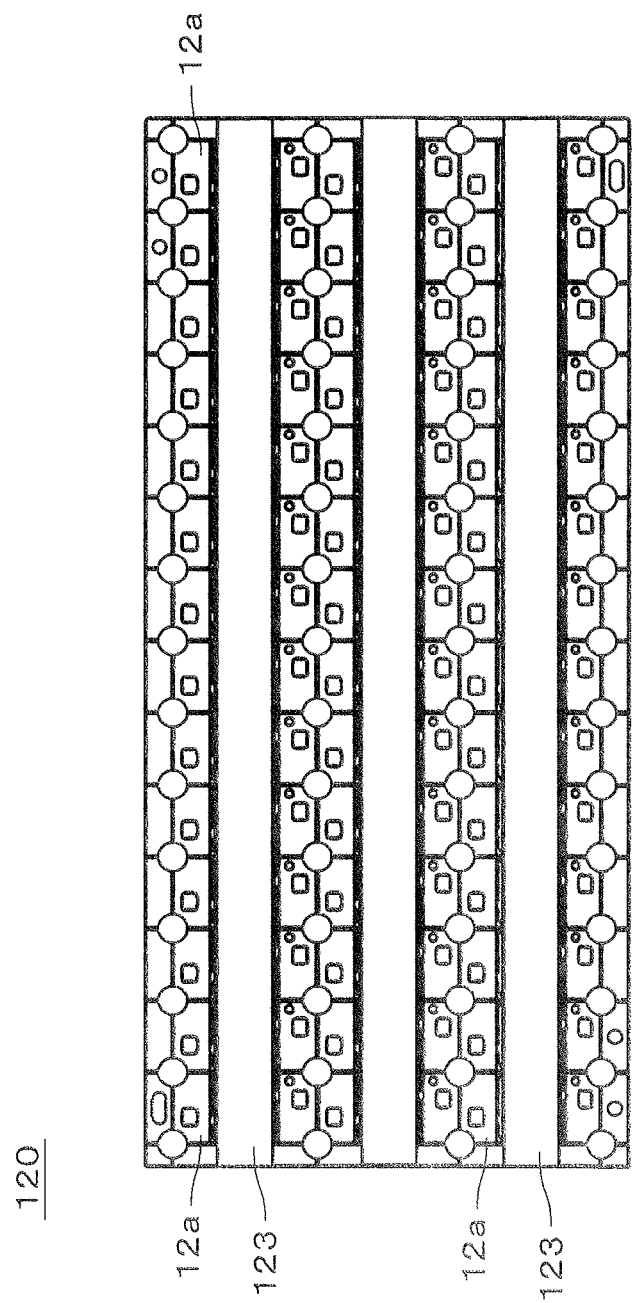
FIG. 9 is a plan view illustrating another example of the continuous substrate.
Figure 10:
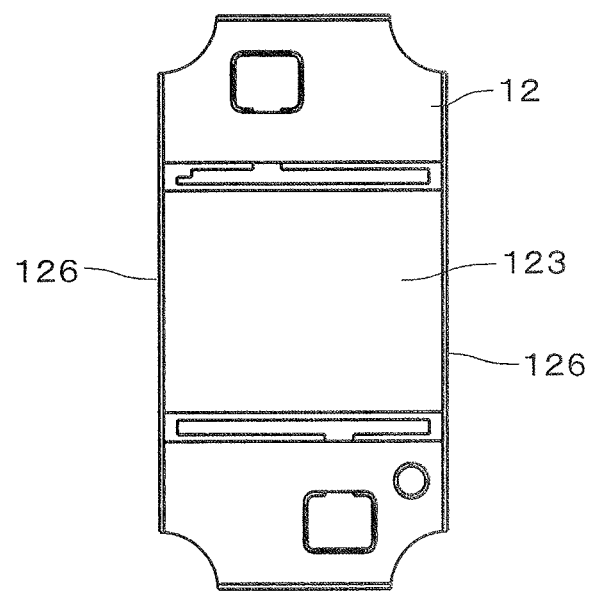
FIG. 10 is a plan view illustrating a substrate.

FIG. 9 is a plan view illustrating another example of the continuous substrate 120. In the continuous substrate 120 of FIG. 9, the mirror surface regions 123 are present continuously in left-right directions. That is, the mirror surface regions 123 are present on the upper surface of the continuous substrate 120 extending over the plurality of substrate portions 12a. Between the substrate portion 12a and the substrate portion 12a, notches for cutting may be provided in the mirror surface region 123. By the continuous mirror surface regions 123, production costs for the continuous substrate 120 can be reduced. When a light-emitting device 11 is produced by using the continuous substrate 120, as shown in FIG. 10, the mirror surface region 123 is present up to the pair of edges 126 of the left and right of the substrate 12 in respective substrates 12. By providing the mirror surface region 123 in this manner, luminous efficacy of the light-emitting device 11 can be improved more compared with the case where the mirror surface region 123 is not present up to the edges 126 of the substrates 12. When the edge 126 has a fine chamfer thereon, the mirror surface region 123 is present up to the position where the mirror surface region 123 is in contact with the chamfered region.

Figure 11:
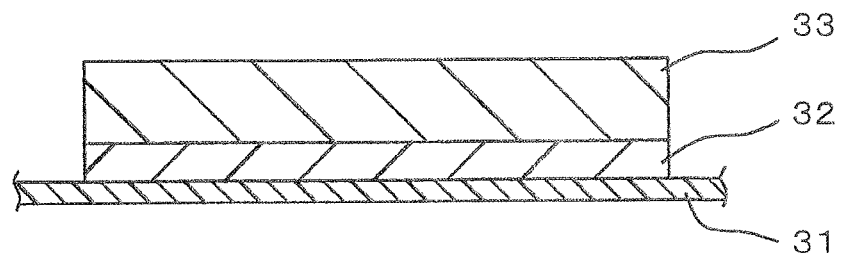
FIG. 11 is a cross section of an encapsulating sheet.

FIG. 11 is a cross section of an encapsulating sheet 130. FIG. 12 is a diagram illustrating a method for producing an encapsulating sheet 130.

The encapsulating sheet 130 includes an elongated flat belt shape release film 31, a first phosphor layer 32 laminated on the release film 31, and a second phosphor layer 33 laminated on the first phosphor layer 32. The encapsulating sheet 130 of FIG. 8 is in a state where the release film 31 is removed.

To produce the encapsulating sheet 130, as shown in FIG. 12.A, first, the first phosphor layer 32 is formed on the release film 31. The release film 31 is formed, for example, from a resin film such as polyethylene terephthalate film, polystyrene film, polypropylene film, polycarbonate film, acrylic film, silicone resin film, styrene resin film, and fluorine resin film. The surface of the release film 31 may be treated for release.

The release film 31 has a thickness of, for example, 20 to 100 µm, preferably 30 to 50 µm. When the release film 31 has a thickness within the above-described range, excellent handling characteristics (handling characteristics at the time when the release film 31 is removed from other sections of the encapsulating sheet 130) can be achieved while suppressing increase in costs.

The first phosphor layer 32 contains phosphor and molding resin as essential components. Examples of phosphor include, for example, yellow phosphor which can convert blue light to yellow light, and red phosphor which can convert blue light to red light.

Examples of yellow phosphor include silicate phosphor such as $(Sr,Ba)_2SiO4:Eu$ (barium orthosilicate (BOS)); α-sialon phosphor such as Ca-α-SiAlON:Eu; and garnet phosphors such as $Y_3Al_5O_{12}:Ce$ (YAG:Ce) and $Tb_3Al_3O_{12}:Ce$ (TAG:Ce). Examples of red phosphor include nitride phosphor such as $CaAlSiN_3:Eu$.

For the phosphor, preferably yellow phosphor, more preferably, silicate phosphor, even more preferably, $(Sr,Ba)_2SiO_4:Eu$ (barium orthosilicate (BOS)) is used. When the phosphor is $(Sr,Ba)_2SiO_4:Eu$ (barium orthosilicate (BOS)), phosphor having various emission wavelengths can be produced easily, and furthermore, achieves effects of realizing much variation of emission wavelength that allows conversion of blue light to yellow light in the light-emitting device 11.

Phosphor is for example particulate, and in terms of volume-based particle size distribution measured by laser diffraction scattering particle size distribution analysis, has a particle size (i.e., median size (D50)) of 50% cumulative percent passing from the small particle size of, for example, 0.1 to 100 µm, preferably 1 to 30 µm.

Examples of molding resins include those resins that allows light to pass through, such as silicone resin, epoxy resin, styrene resin, acrylic resin, polycarbonate resin, urethane resin, and polyolefin resin, and preferably, silicone resin is used. These molding resins may be used singly (only one kind), or may be used in a combination of two or more. When the molding resin contains silicone resin, effects of harsh environment endurance under a wide range of temperature and humidity conditions can be achieved based on its physical characteristics and electrical characteristics.

The molding resin contains preferably 70 mass %, more preferably 90 mass %, even more preferably 100 mass % (that is, only silicone resin) of silicone resin. Examples of silicone resins include commercially available silicone resins, such as silicone elastomer. Examples of silicone elastomer include ERASTOSIL series such as ERASTOSIL LR7665 (manufactured by Wacker Asahikasei Silicone Co., Ltd).

When the molding resin contains silicone resin, by adjusting the crosslinking density of silicone resin, the elasticity of the first phosphor layer 32 can be adjusted such that a constant thickness can be kept even if external force and pressure at the time of encapsulation are applied.

The first phosphor layer 32 may contain, as an optional component, additives such as curing agents, curing accelerators, antioxidants, modifiers, surfactants, dyes, pigments, discoloration inhibitors, and ultraviolet absorbers. The first phosphor layer 32 may also contain, as an optional component, for example, organic particles such as silicone resin microparticles; and inorganic particles such as silica microparticles, barium sulfate, barium carbonate, and barium titanate. These organic particles and inorganic particles may be used singly (only one kind), or may be used in a combination of two or more.

To form the first phosphor layer 32, first, phosphor is blended and mixed to the molding resin, or to a solution of molding resin, thereby preparing a molding resin composition. The mass-based phosphor content (solid content-based, hereinafter referred to as mass percentage) of the molding resin composition can be set by calculating backwards from the volume-based phosphor content (hereinafter volume percentage) of the target first phosphor layer 32.

The volume percentage of phosphor in the molding resin composition can be calculated by formula (1) below:

$$\text{Volume percentage of phosphor} = (\text{mass percentage of phosphor}/\text{specific gravity of phosphor}) \div \{(\text{mass percentage of phosphor}/\text{specific gravity of phosphor}) + (\text{mass percentage of molding resin}/\text{specific gravity of molding resin})\}$$ Formula (1):

Then, the obtained molding resin composition is applied on the release film 31, and dried, thereby producing the first phosphor layer 32. The molding resin composition can be applied on the release film 31 by, for example, casting, spin coating, or roll coating. The molding resin composition applied on the release film 31 is dried, without particular limitation, for example, by heating at 80 to 150° C., preferably 90 to 150° C., for 5 to 60 min.

The obtained first phosphor layer 32 has a thickness of, for example, 30 to 1000 µm, preferably 100 to 700 µm, and more preferably 300 to 600 µm. The volume percentage of phosphor in the obtained first phosphor layer 32 is, although depending on the kind of phosphor, when phosphor is $(Sr,Ba)_2SiO_4:Eu$, for example, 0.1 to 99.9% by volume, preferably 1 to 99% by volume, and more preferably 2 to 15% by volume.

Next, as shown in FIG. 12.B, the second phosphor layer 33 is formed on the first phosphor layer 32. The second phosphor layer 33 contains, as essential components, phosphor and an encapsulating resin. Examples of phosphor include the above-described phosphor given as examples of phosphor for the first phosphor layer 32.

Examples of encapsulating resins include the above-described resins given as examples of the molding resin for the first phosphor layer 32, and preferably, silicone resin is used. These encapsulating resins may be used singly (only one kind), or may be used in a combination of two or more. When the encapsulating resin contains silicone resin, effects of harsh environment endurance under a wide range of temperature and humidity conditions can be achieved based on its physical characteristics and electrical characteristics.

For the silicone resin, preferably, a silicone resin having two reaction systems (reaction system in curing reaction) or a modified silicone resin is used. Examples of silicone resin having two reaction systems include a silicone resin having two reaction systems of silanol condensation and hydrosilylation reaction (e.g., encapsulating resin prepared in Examples described later).

Examples of modified silicone resins include a silicone resin having a hetero siloxane skeleton in which a portion of Si atoms in the siloxane skeleton of the silicone resin is replaced (e.g., borosiloxane in which Si atom is replaced with B atom, aluminosiloxane in which Si atom is replaced with Al atom, phosphasiloxane in which Si atom is replaced with P atom, and titanasiloxane in which Si atom is replaced with Ti atom, etc.).

The second phosphor layer 33 may contain, as an optional component, organic particles such as silicone resin microparticles, and inorganic particles such as silica microparticles, barium sulfate, barium carbonate, and barium titanate. These organic particles and inorganic particles may be used singly (only one kind), or may be used in a combination of two or more.

To form the second phosphor layer 33, first, phosphor is blended and mixed to the encapsulating resin, or a solution of encapsulating resin, thereby preparing an encapsulating resin composition. The mass percentage of phosphor (solid content-based) of the encapsulating resin composition can be set in the same manner as in the above-described mass percentage of phosphor in the molding resin composition, calculating backwards from the volume percentage of phosphor contained in the second phosphor layer 33.

The volume percentage of phosphor in the encapsulating resin composition can be calculated by formula (2) below:

Volume percentage of Phosphor=(mass percentage of phosphor/specific gravity of phosphor)÷{(mass percentage of phosphor/specific gravity of phosphor)+(mass percentage of encapsulating resin/specific gravity of encapsulating resin)}    Formula (2):

Then, the obtained encapsulating resin composition can be applied on the first phosphor layer 32 and dried, thereby producing the second phosphor layer 33. The encapsulating resin composition can be applied on the first phosphor layer 32, for example, in the same manner as in the application of the molding resin composition on the release film 31 as described above.

The encapsulating resin composition applied on the first phosphor layer 32 is dried, for example, by heating at 50 to 160° C., preferably 80 to 150° C., for 5 to 300 min. The obtained second phosphor layer 33 has a thickness of, for example, 30 to 2000 μm, preferably 200 to 1000 μm, and more preferably 400 to 800 μm in view of encapsulation of semiconductor light-emitting elements, workability, and whitening of semiconductor light-emitting elements.

The ratio of the thickness of the second phosphor layer 33 to the thickness of the first phosphor layer 32 is, for example, 5:5 to 9:1, preferably 5.5:4.5 to 7:3. The volume percentage of the phosphor in the obtained second phosphor layer 33 is, depending on the kind of the phosphor, when the phosphor is $(Sr,Ba)_2SiO_4:Eu$, for example, 0.1 to 99.9% by volume, preferably 0.1 to 4% by volume.

The phosphor content in the first phosphor layer 32 and the phosphor content in the second phosphor layer 33 are preferably adjusted so that CIE-y in total luminous flux measurement is adjusted to 0.32 to 0.37 to achieve production of white light from light emission from the encapsulated LED 141. The CIE-y in total luminous flux measurement is measured by, for example, the integrating sphere method using a multichannel photo detector (MCPD-9800, manufactured by Otsuka Electronics Co. Ltd.).

The encapsulating sheet 130 is structured to have two layers basically excluding the release film 31, but the second phosphor layer 33 can also be formed to have the above-described thickness by laminating a plurality of layers.

The form and size of the encapsulating sheet 130 can be suitably adjusted in accordance with the form, size, and number of the encapsulation target (LED 141).

In the obtained encapsulation sheet 130, the ratio of the phosphor volume in the first phosphor layer 32 to the phosphor volume in the second phosphor layer 33 is adjusted, for example, to 90:10 to 55:45, preferably 80:20 to 60:40.

Figure 14:
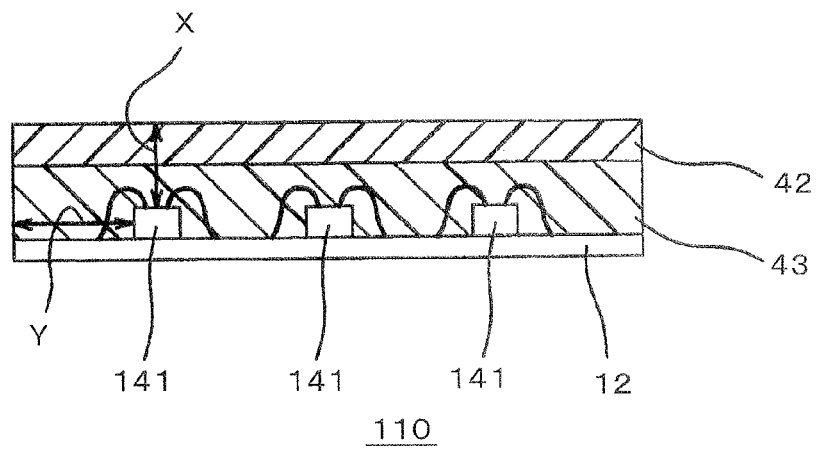
FIG. 14 is a cross sectional view illustrating a light-emitting device assembly.

FIG. 13.A and FIG. 13.B are diagrams illustrating a manner by which the encapsulating sheet 130 is bonded to the continuous substrate 120. FIG. 14 is a schematic diagram illustrating the configuration of a the light-emitting device assembly 110. In these figures, the LED 141 and wires are shown in a simplified manner.

As shown in FIG. 13.A, to encapsulate the LED 141, first, the continuous substrate 120 on which the plurality of LEDs 141 are disposed in spaced-apart relation to each other is placed on a base plate 91 having a generally flat plate shape of a pressing device, and the encapsulating sheet 130 is disposed above the continuous substrate 120 so that the second phosphor layer 33 and the LEDs 141 face each other in up-down direction.

Then, a pressing plate 92 is brought close to the base plate 91 so that the encapsulating sheet 130 is sandwiched between the pressing plate 92 and the base plate 91, and the encapsulating sheet 130 is pressed against the continuous substrate 120. Thereafter, the pressing plate 92 is heated. The temperature of the pressing plate 92 is, for example, 120 to 200° C., preferably 140 to 180° C. The pressing plate 92 is pressed against the encapsulating sheet 130 with a pressure of, for example, 0.01 to 10 MPa, preferably 0.1 to 4 MPa.

In this manner, as shown in FIG. 13.B, the LEDs 141 are embedded in the second phosphor layer 33. By continuously heating the first phosphor layer 32 and the second phosphor layer 33, the first phosphor layer 32 is cured to form the first fluorescent layer 42, and the second phosphor layer 33 is cured to form the second fluorescent layer 43. The first fluorescent layer 42 and the second fluorescent layer 43 form the two-layered structure encapsulating layer 130. The second fluorescent layer 43 is a lower layer of the encapsulating layer 130. The second fluorescent layer 43 is a layer that is in contact with the upper surface of the continuous substrate 120, and substantially covers the surrounding of the LEDs 141 to encapsulate the LEDs 141. The first fluorescent layer 42 is an upper layer that is positioned on the lower layer in the encapsulating layer 130. Lastly, the release film 31 is removed, as shown in FIG. 14, thereby producing a light-emitting device assembly 110.

In the light-emitting device assembly 110, distance X between the surface of the first fluorescent layer 42 and the LEDs 141 in the facing direction (up-down direction on the plane of the sheet in FIG. 14) of the LEDs 141 and the first fluorescent layer 42 is, for example, 500 to 2000 μm, preferably 600 to 1000 μm. Distance Y between the surface of the second fluorescent layer 43 (precisely, the circumferential edge of the encapsulating layer 13 shown in FIG. 3) in the direction perpendicular to the facing direction (left-right directions on the plane of the sheet in FIG. 14) and the LEDs 141 (the LED 141 nearest to the side face of the second fluorescent layer 43) is, for example, 500 to 5000 μm, preferably 1000 to 3000 μm. The ratio of distance X to distance Y is, for example, 1:10 to 4:1, preferably 1:5 to 2:1.

In the encapsulating sheet 130, the ratio of the phosphor volume in the first phosphor layer 32 to the phosphor volume in the second phosphor layer 33 is adjusted to 90:10 to 55:45. Thus, in the light-emitting device 11, the ratio of the phosphor volume in the first fluorescent layer 42 to the phosphor volume in the second fluorescent layer 43 is adjusted to 90:10 to 55:45. As a result, changes in the chromaticity of the light from the light-emitting device 11 depending on the viewing angle can be reduced.

When the phosphor content in the first phosphor layer 32 is more than the above-described range (90), there is a disadvantage in that the chromaticity of the light from the light-emitting device 11 changes greatly depending on the angle (viewing angle) at which the light-emitting device 11 is visually checked. When the phosphor content in the second phosphor layer 33 is more than the above-described range (45), there is a disadvantage in that the chromaticity of the light from the light-emitting device 11 changes greatly depending on the angle (viewing angle) at which the light-emitting device 11 is visually checked.

In the light-emitting device 11, as shown in FIG. 14, distance Y between the side face of the second fluorescent layer 43 and the LED 141 is longer than distance X between the surface of the first fluorescent layer 42 and the LED 141. Thus, the light that passes through the side face of the second fluorescent layer 43 without passing through the first fluorescent layer 42 can be whitened by the phosphor of the second fluorescent layer 43.

Next, Examples and Comparative Examples of the encapsulating sheet 130 are described. However, the encapsulating sheet 130 is not limited to those shown in Examples.

1. Preparation of Molding Resin

A solution and B solution of ELASTOSIL LR7665 (dimethylsiloxane skeleton derivative manufactured by Wacker Asahikasei Silicone Co., Ltd) were mixed at a ratio of 1:1, thereby preparing a molding resin. The molding resin obtained had a specific gravity of 1.0 g/cm$^3$.

2. Preparation of Encapsulating Resin 15.76 g (0.106 mol) of vinyltrimetoxysilane and 2.80 g (0.0118 mol) of (3-glycidoxypropyl) trimetoxysilane were blended with 2031 g (0.177 mol) of polysiloxane having silanol groups at both ends heated to 40° C. (in formula (1) below, R1 was all methyl, the average of n was 155, number average molecular weight 11,500, and silanol group equivalent 0.174 mmol/g), and the mixture was stir-mixed.

The molar ratio of the silanol group (SiOH) of polydimethylsiloxane having silanol groups at both ends to the methoxysilyl group (SiOCH$_3$) of vinyltrimetoxysilane and (3-glycidoxypropyl) trimetoxysilane (the number of moles of the silanol group/the total number of moles of the methoxysilyl group) was 1/1.

After the stir-mixing, 0.97 mL (catalyst content: 0.88 mmol, equivalent to 0.50 mol relative to 100 mol of polydimethylsiloxane having silanol groups at both ends) of a solution of tetramethylammonium hydroxide in methanol (condensation catalyst, concentration 10 mass %) was added thereto, and the mixture was stirred at 40° C. for 1 hour. The obtained mixture (oil) was stirred for 1 hour at 40° C. under reduced pressure (10 mmHg) to remove volatile components (methanol, etc.).

Thereafter, the pressure of the system was reset to normal, and thereafter, 44.5 g (0.022 mol) of organo hydrogen siloxane (manufactured by Shin-Etsu Chemical Co., Ltd., number average molecular weight 2,000, hydrosilyl group equivalent 7.14 mmol/g) was added to the reaction product, and the mixture was stirred at 40° C. for 1 hour.

The molar ratio of the vinyl group ($CH_2$=CH—) of vinyltrimetoxysilane relative to the hydrosilyl group (SiH group) of organo hydrogen siloxane ($CH_2$=CH—/SiH) was 1/3.

Thereafter, 0.13 mL (equivalent to $5.8 \times 10^{-3}$ parts by mass of platinum relative to 100 parts by mass of organo hydrogen siloxane) of a solution of platinum-carbonyl complex in siloxane (addition catalyst, platinum concentration 2 mass %) was added to the system, and the mixture was stirred at 40° C. for 10 min, thereby producing an encapsulating resin.

The obtained encapsulating resin had a specific gravity of 1.0 g/cm$^3$.

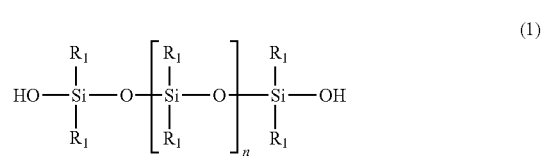

3. Examples and Comparative Examples

Example 1

Production of Encapsulating Sheet

To 85 g of a molding resin, 15 g of phosphor (($Sr,Ba)_2SiO_4$:Eu (barium orthosilicate) specific gravity: 4.8 g/cm$^3$) was blended, and the mixture was stir-mixed for 1 hour, thereby preparing a molding resin composition containing 15 mass % of phosphor.

The obtained molding resin composition was applied on a release film (polyester film: SS4C, manufactured by Nippa CO., LTD., thickness 50 μm) so that the thickness of the molding resin composition was 400 μm, and dried at 100° C. for 10 min, thereby forming a first phosphor layer laminated on the release film (ref: FIG. 12.A).

Then, to 93 g of the encapsulating resin, 7 g of phosphor (($Sr,Ba)_2SiO_4$:Eu (barium orthosilicate)) was blended, and mixed, thereby preparing an encapsulating resin composition containing 7 mass % of phosphor.

The obtained encapsulating resin composition was applied on the first phosphor layer so that the thickness of the encapsulating resin composition was 600 μm, and dried at 135° C. for 5 minutes. In this manner, the encapsulating resin composition was semi-cured, thereby forming a second phosphor layer (ref: FIG. 12.B).

The encapsulating sheet was obtained in this manner.

Table 1 shows the volume ratio of the phosphor contained in the first phosphor layer to the phosphor contained in the second phosphor layer.

(Production of Light-Emitting Device)

The encapsulating sheet was disposed so that the second phosphor layer faces blue LED chips of an LED array substrate (an LED array substrate having nine (3 (row)×3 (column)) blue LED chips mounted on a metal substrate having an external size of 22 mm×15 mm and formed with recess portions of 12 mmφ and a 150 μm depth, blue LED chips are disposed at a 3 mm interval in the recess portion) (ref: FIG. 13.A).

While the encapsulating sheet was heated at 160° C. using a metal-made pressing plate, the encapsulating sheet was pressed toward the blue LED chips at a pressure of 0.1 Mpa for 5 minutes, thereby encapsulating the blue LED chips.

Lastly, the release film was removed, thereby producing a light-emitting device.

Example 2

Production of Encapsulating Sheet

An encapsulating sheet was obtained in the same manner as in Example 1 described above, except that the molding resin composition contained 16.5 mass % of phosphor, and the encapsulating resin composition contained 6 mass % of phosphor.

Table 1 shows the volume ratio of the phosphor contained in the first phosphor layer to the phosphor contained in the second phosphor layer.

(Production of Light-Emitting Device)

Blue LED chips were encapsulated using the encapsulating sheet obtained in the same manner as in Example 1 described above, thereby producing a light-emitting device.

Example 3

Production of Encapsulating Sheet

To 83 g of a molding resin, 17 g of phosphor (($Sr,Ba)_2SiO_4$: Eu (barium orthosilicate)) was blended, and the mixture was stir-mixed for 1 hour, thereby preparing a molding resin composition containing 17 mass % of phosphor.

The obtained molding resin composition was applied on a release film (polyester film: SS4C, manufactured by Nippa CO, LTD., thickness 50 μm) so that the thickness of the molding resin composition was 500 μm, and dried at 100° C. for 10 min, thereby forming a first phosphor layer laminated on the release film (ref: FIG. 12.A).

Then, to 95 g of the encapsulating resin, 5 g of phosphor (($Sr,Ba)_2SiO_4$:Eu (barium orthosilicate)) was blended, and mixed, thereby preparing an encapsulating resin composition containing 5 mass % of phosphor.

The obtained encapsulating resin composition was applied on the first phosphor layer so that the thickness of the encapsulating resin composition was 600 μm, and dried at 135° C. for 5 minutes. In this manner, the encapsulating resin composition was semi-cured, thereby forming a second phosphor layer (ref: FIG. 12.B).

The encapsulating sheet was obtained in this manner.

Table 1 shows the volume ratio of the phosphor contained in the first phosphor layer to the phosphor contained in the second phosphor layer.

Example 4

Production of Encapsulating Sheet

An encapsulating sheet was obtained in the same manner as Example 3 as described above, except that the molding resin composition contained 20 mass % of phosphor, and the encapsulating resin composition contained 3 mass % of phosphor.

Table 1 shows the volume ratio of the phosphor contained in the first phosphor layer to the phosphor contained in the second phosphor layer.

(Production of Light-Emitting Device)

Blue LED chips were encapsulated using the encapsulating sheet obtained in the same manner as in Example 1 described above, thereby producing a light-emitting device.

Comparative Example 1

Production of Encapsulating Sheet

An encapsulating sheet was obtained in the same manner as in Example 3 as described above, except that the molding resin composition contained 23 mass % of phosphor, and the encapsulating resin composition contained 1 mass % of phosphor.

Table 1 shows the volume ratio of the phosphor contained in the first phosphor layer to the phosphor contained in the second phosphor layer.

(Production of Light-Emitting Device)

Blue LED chips were encapsulated using the encapsulating sheet obtained in the same manner as in Example 1 described above, thereby producing a light-emitting device.

Comparative Example 2

Production of Encapsulating Sheet

An encapsulating sheet was obtained in the same manner as in Example 1 described above, except that the molding resin composition contained 63 mass % of phosphor, and the encapsulating resin composition contained no phosphor.

Table 1 shows the volume ratio of the phosphor contained in the first phosphor layer to the phosphor contained in the second phosphor layer.

(Production of Light-Emitting Device)

Blue LED chips were encapsulated using the encapsulating sheet obtained in the same manner as in Example 1 described above, thereby producing a light-emitting device.

Comparative Example 3

Production of Encapsulating Sheet

An encapsulating sheet was obtained in the same manner as in Example 1 described above, except that the encapsulating resin composition contained 13.5 mass % of phosphor, and the second phosphor layer was formed on the release film without forming the first phosphor layer.

Table 1 shows the volume ratio of the phosphor contained in the first phosphor layer to the phosphor contained in the second phosphor layer.

(Production of Light-Emitting Device)

Blue LED chips were encapsulated using the encapsulating sheet obtained in the same manner as in Example 1 described above, thereby producing a light-emitting device.

Figure 15:
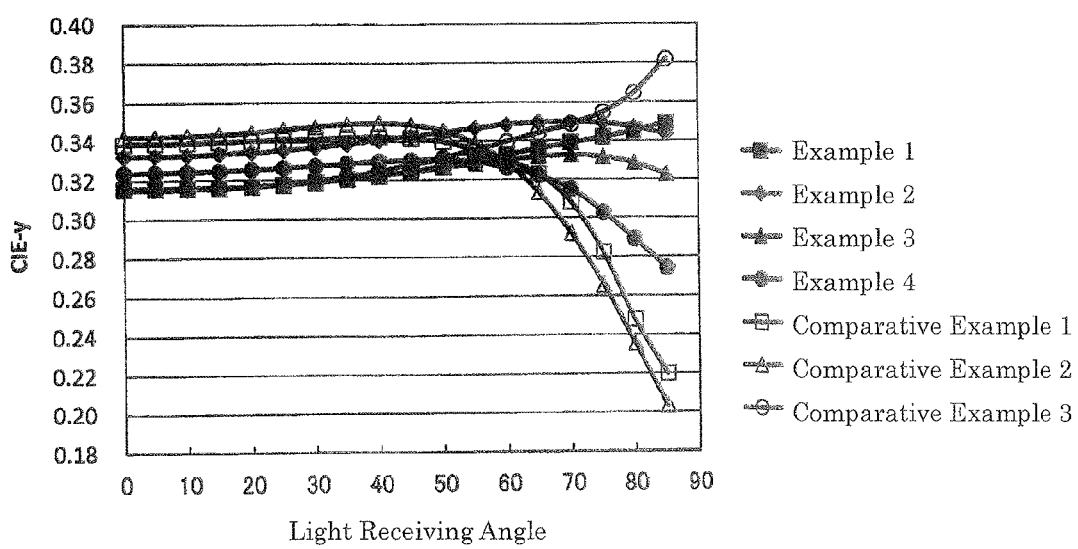
FIG. 15 is a diagram illustrating changes in chromaticity depending on viewing angles in light-emitting devices of Examples and Comparative Examples.

4. Evaluation on Measurement of Light Emission of Light-Emitting Device (1) Light Distribution Characteristics Evaluation The light-emitting devices obtained in Examples and Comparative Examples were turned on at 270 mA, and their chromaticities (CIE-y) were measured by an LED goniophotometer system (GP-1000, manufactured by Otsuka Electronics Co. Ltd.), while changing the viewing angle in the range of 0° (facing direction of the first fluorescent layer and the light-emitting diode) to 85° (direction perpendicular to the facing direction). The results are shown in FIG. 15.

The difference of the measured maximum chromaticity and the minimum chromaticity (maximum chromaticity difference) is shown in Table 1. The smaller the maximum chromaticity difference, the smaller the change in chromaticity depending on the viewing angle, with excellent light distribution characteristics.

Furthermore, the color of the light outputted from the side face (face in the direction perpendicular to the facing direction) of the light-emitting device is evaluated by visual check based on the criteria below. The results are shown in Table 1.

(Evaluation Criteria of Visual Evaluation)
Good: light can be seen as white.
Bad: light can be seen as blue or yellow.
(2) Total Luminous Flux Measurement
The light-emitting devices obtained in Examples and Comparative Examples were turned on at 270 mA, and the chromaticity (CIE-y) were measured by the integrating sphere method with a multi channel photo detector (MCPD-9800, manufactured by Otsuka Electronics Co. Ltd.). The results are shown in Table 1.

TABLE 1

| | Layer Thicknesses (μm) | | Volume Ratio of Phosphor | | Light Distribution Characteristics | | Total Luminous Flux CIE-y |
|---|---|---|---|---|---|---|---|
| | First Phosphor Layer | Second Phosphor Layer | First Phosphor Layer | Second Phosphor Layer | Maximum Chromaticity Difference | Visual Evaluation | |
| Ex. 1 | 400 | 600 | 61 | 39 | 0.034 | Good | 0.34 |
| Ex. 2 | 400 | 600 | 67 | 33 | 0.017 | Good | 0.35 |
| Ex. 3 | 500 | 600 | 76 | 24 | 0.017 | Good | 0.33 |
| Ex. 4 | 500 | 600 | 87 | 13 | 0.056 | Good | 0.33 |
| Comp. Ex. 1 | 500 | 600 | 96 | 4 | 0.122 | Bad | 0.33 |
| Comp. Ex. 2 | 500 | 600 | 100 | 0 | 0.146 | Bad | 0.33 |
| Comp. Ex. 3 | 0 | 600 | 0 | 100 | 0.067 | Bad | 0.34 |

Description is given above for the light-emitting device 11 and the lighting device 20. In the light-emitting device 11, the phosphor content per unit area of the first fluorescent layer 42, i.e., the upper layer of the encapsulating layer 13, is larger than the phosphor content per unit area of the second fluorescent layer 43, i.e., the lower layer of the encapsulating layer 13, and therefore changes in the chromaticity of outputted from the light-emitting device 11 and the lighting device 20 depending on the viewing angle can be reduced easily. The "phosphor content per unit area" means the phosphor content per unit area substrate 12 when viewed from the top along the normal line.

Furthermore, the LED 141 is disposed in the mirror surface region 123, and therefore the fluorescent light generated in the first fluorescent layer 42 and the second fluorescent layer 43 can be guided efficiently in a desired output direction. Thus, the luminous efficacy of the light-emitting device 11 can be improved. The encapsulating layer 13 is disposed on the mirror surface region 123, and therefore the bonding strength between the encapsulating layer 13 and the substrate 12 improves.

The encapsulating layer 13 is formed by using the encapsulating sheet 130, and therefore compared with the case where phosphor is applied, working hours are reduced, and variations in brightness and emission color due to variations in phosphor sedimentation velocity and the resin amount can be reduced. The encapsulating layer 13 is relatively thick, and therefore the light from the LED 141 sufficiently disperses, and compared with the case where phosphor is applied on the LED, emission irregularities of the encapsulating layer 13 is reduced. The encapsulating layer 13 is rectangular, and therefore loss of the encapsulating sheet 130 can be decreased. Furthermore, the encapsulating layer 13 is present to the edge 126 of the substrate 12, and therefore the emission area can be made larger.

Figure 16:
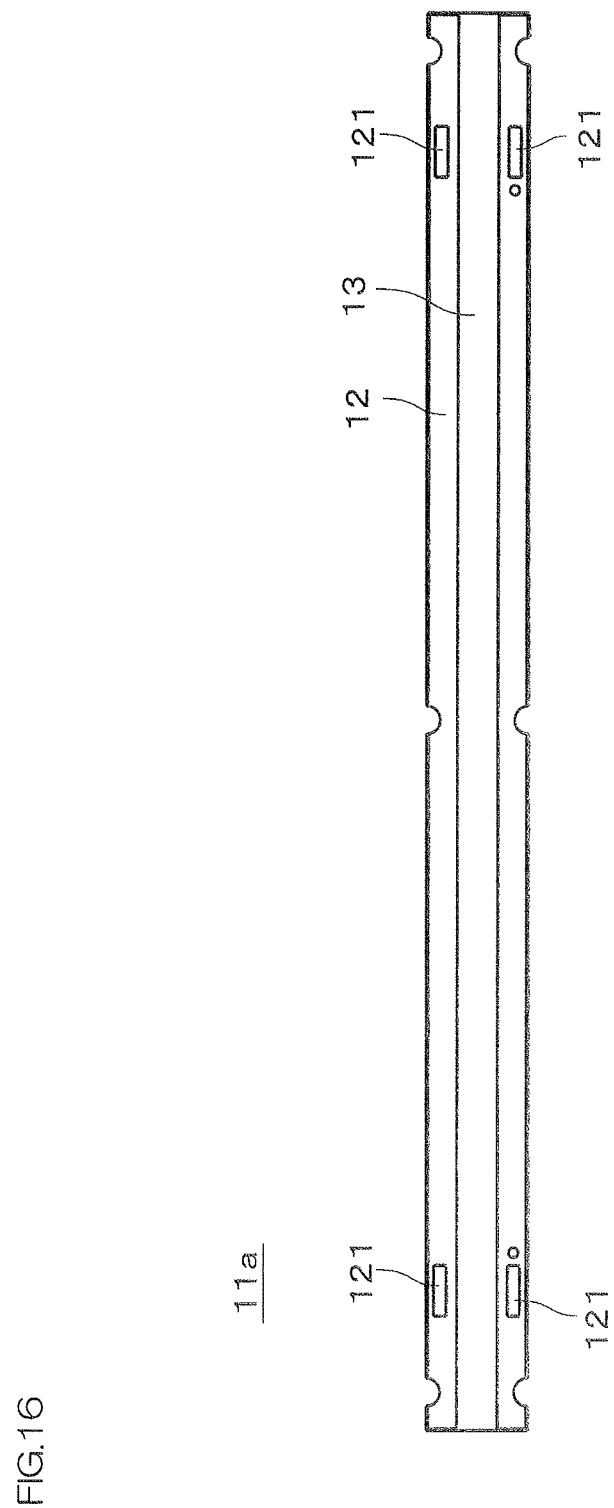
FIG. 16 is a plan view illustrating another example of the light-emitting device.

FIG. 16 is a plan view illustrating another example of a light-emitting device 11a. The light-emitting device 11a has a substrate 12 which is long and narrow. The encapsulating layer 13 is disposed on the upper surface of the substrate 12 along the longitudinal direction of the substrate 12. External electrodes 121 are provided on the both sides of the encapsulating layer 13.

Figure 17:
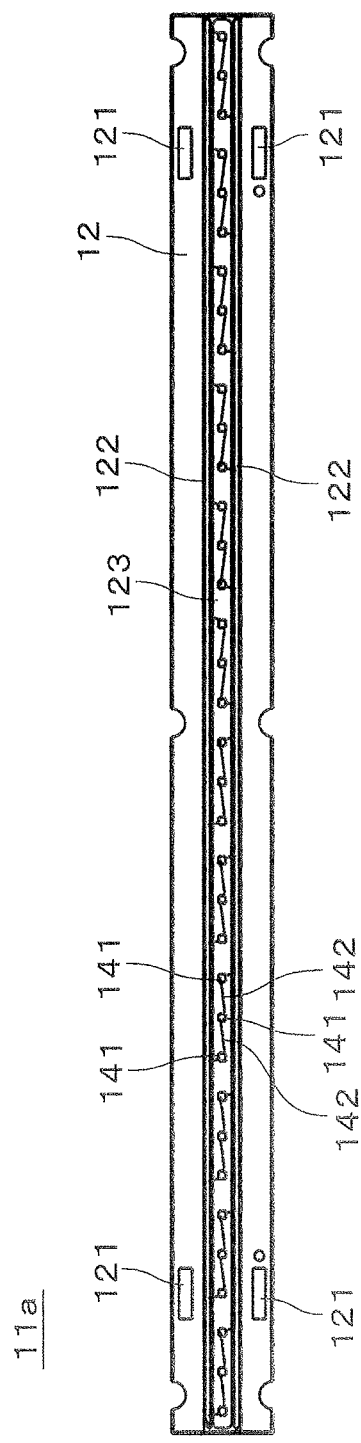
FIG. 17 is a plan view of a light-emitting device excluding an encapsulating layer.

FIG. 17 is a plan view of a light-emitting device 11a from which an encapsulating layer 13 is removed (that is, before bonding an encapsulating sheet 130). The upper surface of the substrate 12 includes a long and narrow mirror surface region 123 extending in the longitudinal direction of the substrate 12. The long and narrow internal electrodes 122 are disposed at both (up-down in FIG. 17) sides of the mirror surface region 123. The external electrodes 121 and the internal electrodes 122 are electrically connected. In the mirror surface region 123, a plurality of LEDs 141 are disposed. The basic structure of the substrate 12 is the same as that shown in FIG. 5. That is, the main portion of the substrate 12 is an aluminum substrate 151, and the mirror surface region 123 is the surface of the aluminum substrate 151. The structure of the encapsulating sheet 130 and the encapsulating layer 13 is the same as that of the light-emitting device 11 shown in FIG. 3.

In the example shown in FIG. 17, the LEDs 141 are disposed in line along the mirror surface region 123. Three LEDs 141 are connected in series between a pair of internal electrodes 122. The connection of the LEDs 141 is not limited to such, and the LED 141 may be individually connected between a pair of internal electrodes 122, two or four or more LEDs 141 may be connected in series between a pair of internal electrodes 122. The wire 142 allowing connection between the electrodes of LEDs 141, and the wire 142 allowing connection between the internal electrodes 122 and the electrodes of the LED 141 are not in contact with the mirror surface region 123. Similarly to the case shown in FIG. 4, by not providing a connection pad in the mirror surface region 123, guiding efficiency of light from the light-emitting device 11a can be improved.

The encapsulating layer 13 is joined to the upper surface of the substrate 12 along the mirror surface region 123. The pair of internal electrodes 122 are covered with the encapsulating layer 13. In this manner, the whole section relating to the connection of LEDs 141 is protected by the encapsulating layer 13. In the substrate 12, four external electrodes 121 are provided near the four corners of the substrate 12. When a lined lighting device is to be produced by arranging a plurality of light-emitting devices 11a in a longitudinal direction, the external electrodes 121 of the adjacent substrates 12 are connected by wiring. The encapsulating layer 13 is present up to the edge of the both ends of the substrate 12, and therefore when a plurality of light-emitting devices 11a are arranged in the longitudinal direction, the encapsulating layer 13 is present substantially continuously in the longitudinal direction, thus the joint in lines are not so obvious. In a light-emitting device 11a having a line emission region, the LEDs 141 can be disposed in a variety of modes as long as the LEDs 141 are disposed along the mirror surface region 123. For example, the LEDs 141 can be disposed in two or more lines, or disposed in a staggered manner.

The light-emitting device 11a is produced in the same manner as the production of the light-emitting device 11 of FIG. 3 except that the shape of the substrate 12 and the disposition of the LEDs 141 are different.

Figure 18:
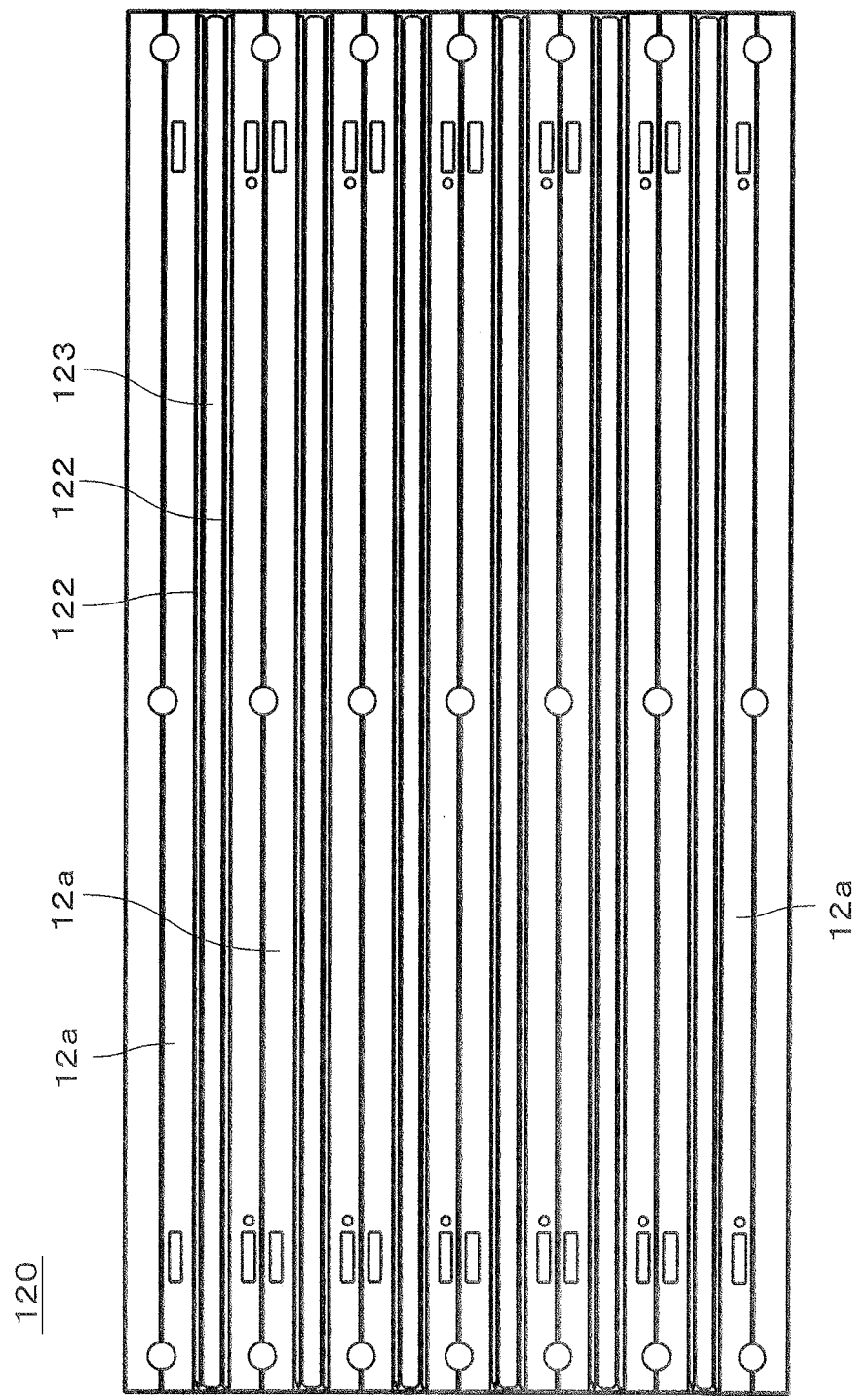
FIG. 18 is a plan view of a continuous substrate.

First, as shown in FIG. 18, a continuous substrate 120 including substrate portions 12a corresponding to the plurality of substrate 12 is prepared. The LEDs 141 are disposed in the mirror surface region 123 (FIG. 6: step S11). Then, the internal electrodes 122 and the electrodes of the LEDs 141, and the electrodes of the LEDs 141 are connected by the wire 142 (step S12). The two-layer structure encapsulating sheet 130 is bonded to the upper surface of the substrate portion 12a so as to cover the mirror surface region 123 (step S13), and the surrounding of the LEDs 141 is covered with the second phosphor layer 33. The encapsulating sheet 130 is cured by heating, to form an encapsulating layer 13 (step S14). However, unlike the case shown in FIG. 8, one encapsulating sheet 130 forms the encapsulating layer 13 of one light-emitting device 11a. Lastly, by separating the substrate portion s 12a of the continuous substrate 120, the light-emitting device 11a is produced (step S15).

In the light-emitting device 11a as well, the phosphor content per unit area of the first fluorescent layer 42, the upper layer of the encapsulating layer 13 is larger than the phosphor content per unit area of the second fluorescent layer 43, the lower layer of the encapsulating layer 13, and therefore changes in chromaticity of the light output from the light-emitting device 11a depending on the viewing angle can be easily reduced. Furthermore, the LED 141 is disposed in the mirror surface region 123, and therefore the fluorescent light generated in the first fluorescent layer 42 and the second fluorescent layer 43 can be efficiently guided. The encapsulating layer 13 is disposed on the mirror surface region 123, and therefore bonding strength between the encapsulating layer 13 and the substrate 12 is improved.

Embodiments of the present invention are described above. However, the present invention is not limited to the above-described embodiments, and various changes can be applied.

The semiconductor light-emitting element is not limited to light-emitting diodes. The semiconductor light-emitting element may be another light-emitting element produced by using semiconductor device production technologies. The substrate 12 may be a substrate having a main portion of a material of metal other than aluminum or another material excellent in thermal conductivity. The light-emitting device 11 may be produced individually using the substrate 12, without using the continuous substrate 120. In this case, step S15 in FIG. 6 is omitted.

The encapsulating layer 13 does not necessarily have the two layer structure in strict sense, as long as it can be substantially interpreted as a two layer structure. For example, the encapsulating layer 13 may have three layers having a phosphor content becoming smaller toward the bottom, the upper two layers being the upper layers having larger phosphor contents, and the one layer at the lower side being the lower layer that encapsulates the LED 141. The number of the LEDs 141 disposed in one mirror surface region 123 may be one.

In above-described embodiment, the first phosphor layer 32 and the second phosphor layer 33 are sequentially laminated on the release film 31; however, for example, the first phosphor layer 32 and the second phosphor layer 33 may be formed individually on different films, and thereafter, the first phosphor layer 32 and the second phosphor layer 33 may be bonded by a method such as thermocompression bonding. In the above-described embodiment, the release film 31 is removed after the LED 141 is encapsulated with the encapsulating sheet 130; however, the LED 141 can be encapsulated after removal of the release film 31 from the encapsulating sheet 130.

In the above-described embodiment, the encapsulating sheet 130 is pressed against the substrate 12 by the generally flat plate pressing plate 92; however, instead of the pressing plate 92, the encapsulating sheet 130 may be pressed using a mold having a predetermined shape.

The configurations in the above-described embodiments and variations may be combined as long as no contradictions occur.

While the illustrative embodiments of the present invention are provided in the above description, they are for illustrative purposes only and not to be construed as limiting. Modifications and variations of the present invention that will be obvious to those skilled in the art is to be covered by the appended claims.

What is claimed is:

1. A light-emitting device comprising:
    a substrate including a mirror surface region on its upper surface,
    a semiconductor light-emitting element disposed in the mirror surface region, and
    an encapsulating layer joined onto the upper surface of the substrate, wherein
    the encapsulating layer comprises
    a lower layer that is in contact with the upper surface of the substrate, covers an upper surface and a side surface of the semiconductor light-emitting element, and contains phosphor, and
    an upper layer that is positioned on the lower layer so as to be above and spaced apart from the semiconductor light-emitting element, and has a larger phosphor content per unit area than that of the lower layer,
    the substrates includes an aluminum substrate having the mirror surface region in an upper surface, an insulating layer disposed on the aluminum substrate so as to expose the mirror surface region, and an electrode electrically connected to the semiconductor light-emitting element,
    the mirror surface region is a region of the aluminum substrate exposed from the insulating layer and is present up to a pair of opposing edges of the substrate,
    the electrode is disposed on the insulating layer outside the mirror surface region, and
    the encapsulating layer is rectangular and is joined onto the mirror surface region such that a pair of opposing edges of the encapsulating layer coincide with the pair of edges of the substrate.

2. The light-emitting device according to claim 1, wherein
    a plurality of semiconductor light-emitting elements that are connected in series are disposed in the mirror surface region, and
    a wire that connects the plurality of semiconductor light-emitting elements is not in contact with the mirror surface region.

3. The light-emitting device according to claim 1, wherein electrodes that are on the substrate and are connected to the electrodes of the semiconductor light-emitting elements are covered with the encapsulating layer.

4. The light-emitting device according to claim 1, wherein
    the mirror surface region is long and narrow,
    a plurality of semiconductor light-emitting elements are disposed along the mirror surface region, and
    the encapsulating layer is joined onto the upper surface of the substrate along the mirror surface region.

5. The light-emitting device according to claim 1, wherein
the lower surface contains 0.1 to 4% by volume of the phosphor,
the upper surface contains 2 to 15% by volume of the phosphor,
the ratio of a thickness of the lower layer to a thickness of the upper layer is 5:5 to 9:1, and
when receiving light from the semiconductor light-emitting element in the range of 0° to 85° as the angle facing the direction of the upper layer and the semiconductor light-emitting element, the chromaticity of the light from the semiconductor light-emitting element is from 0.32 to 0.37.

6. A lighting device comprising:
a light-emitting device,
a housing in which the light-emitting device is disposed, and
a window portion attached to the housing, through which the light from the light-emitting device passes through, wherein
the light-emitting device includes
a substrate including a mirror surface region on its upper surface;
a semiconductor light-emitting element disposed in the mirror surface region;
an encapsulating layer joined onto the upper surface of the substrate;
wherein
the encapsulating layer comprises
a lower layer that is in contact with the upper surface of the substrate, covers an upper surface and a side surface of the semiconductor light-emitting element, and contains phosphor, and
an upper layer that is positioned on the lower layer so as to be above and spaced apart from the semiconductor light-emitting element and has a larger phosphor content per unit area than that of the lower layer,
the substrates includes an aluminum substrate having the mirror surface region in an upper surface, an insulating layer disposed on the aluminum substrate so as to expose the mirror surface region, and an electrode electrically connected to the semiconductor light-emitting element,
the mirror surface region is a region of the aluminum substrate exposed from the insulating layer and is present up to a pair of opposing edges of the substrate,
the electrode is disposed on the insulating layer outside the mirror surface region, and
the encapsulating layer is rectangular and is joined onto the mirror surface region such that a pair of opposing edges of the encapsulating layer coincide with the pair of edges of the substrate.

7. A light-emitting device assembly comprising:
a continuous substrate including a mirror surface region on its upper surface, and having a plurality of sections corresponding to substrates of a plurality of light-emitting devices,
a plurality of semiconductor light-emitting elements disposed in the mirror surface region, and
an encapsulating layer joined onto the upper surface of the continuous substrate, extending over the plurality of sections corresponding to the substrates of the plurality of light-emitting devices
wherein
the encapsulating layer comprises
a lower layer that is in contact with the upper surface of the continuous substrate, covers an upper surface and a side surface of the plurality of semiconductor light-emitting elements, and contains phosphor, and
an upper layer that is positioned on the lower layer so as to be above and spaced apart from the semiconductor light-emitting element, and has a larger phosphor content per unit area than that of the lower layer,
the substrates includes an aluminum substrate having the mirror surface region in an upper surface, an insulating layer disposed on the aluminum substrate so as to expose the mirror surface region, and an electrode electrically connected to the semiconductor light-emitting element,
the mirror surface region is a region of the aluminum substrate exposed from the insulating layer and is present on the upper surface of the aluminum substrate of the continuous substrate, extending over the plurality of sections corresponding to the substrates of the plurality of light-emitting devices,
the electrode is disposed on the insulating layer outside the mirror surface region, and
the encapsulating layer is joined onto the mirror surface region so as to extend over the mirror surface regions which are provided in the plurality of sections corresponding to the substrates of the plurality of light-emitting devices.

* * * * *